(12) United States Patent
Holdsclaw (10) Patent No.: US 7,756,651 B2
(45) Date of Patent: Jul. 13, 2010

(54) FRACTIONAL SAMPLING OF ELECTRICAL ENERGY

(75) Inventor: Scott T. Holdsclaw, Raleigh, NC (US)

(73) Assignee: Elster Electricity, LLC, Raleigh, NC (US)

( * ) Notice: Subject to any disclaimer, the term of this patent is extended or adjusted under 35 U.S.C. 154(b) by 528 days.

(21) Appl. No.: 11/418,596

(22) Filed: May 5, 2006

(65) Prior Publication Data
US 2007/0262768 A1    Nov. 15, 2007

(51) Int. Cl.
*G01R 13/02*    (2006.01)
(52) U.S. Cl. .............................. 702/60; 702/61; 702/66; 702/71
(58) Field of Classification Search .................. 702/60, 702/61, 64, 117, 189, 182, 183; 324/142; 340/201; 700/293; 70/293
See application file for complete search history.

(56) References Cited

U.S. PATENT DOCUMENTS

| | | | |
|---|---|---|---|
| 4,162,443 A | 7/1979 | Brearley et al. | 327/78 |
| 4,224,568 A | 9/1980 | Griner | 324/78 |
| 4,709,339 A | 11/1987 | Fernandes | |
| 5,544,089 A | 8/1996 | Hemminger et al. | 364/492 |
| 5,587,917 A | 12/1996 | Elms | |
| 5,631,554 A | 5/1997 | Briese et al. | 324/76.77 |
| 5,736,847 A | 4/1998 | Van Doorn et al. | |
| 5,999,561 A * | 12/1999 | Naden et al. | 375/142 |
| 6,094,622 A * | 7/2000 | Hubbard et al. | 702/61 |
| 6,128,584 A | 10/2000 | Hemminer et al. | 702/75 |
| 6,141,626 A * | 10/2000 | Holdsclaw et al. | 702/60 |
| 6,329,806 B1 | 12/2001 | Reck et al. | 324/76.24 |
| 6,374,188 B1 * | 4/2002 | Hubbard et al. | 702/61 |
| 6,954,061 B2 * | 10/2005 | Hemminger et al. | 324/142 |
| 2002/0033694 A1 | 3/2002 | Sezi et al. | 324/76.11 |
| 2009/0287428 A1 | 11/2009 | Holdsclaw | |

FOREIGN PATENT DOCUMENTS

| | | |
|---|---|---|
| JP | 2000/180484 | 6/2000 |
| JP | 2000180484 | 8/2008 |

OTHER PUBLICATIONS

Moulin, E., "RMS Calculation for Energy Meter Applications Using the ADE7756", AN-578 Application Note, 2003 Analog Devices, Inc., 8 pages.
From the International Searching Authority, PCT Notification of Transmittal of the International Search Report and the Written Opinion of the International Searching Authority, or the Declaration, International Application No. PCT/US07/68253, Dated Jul. 21, 2008, 9 pages.
International Search Report and Written Opinion for PCT/US2009/042984 mailed Jun. 26, 2009.
International Search Report and Written Opinion for PCT/US2007/068253 mailed Jul. 21, 2008.

* cited by examiner

*Primary Examiner*—Hal D Wachsman
*Assistant Examiner*—Felix E Suarez
(74) *Attorney, Agent, or Firm*—Woodcock Washburn LLP (57) ABSTRACT

A novel method and device for measuring electrical parameters in an energy meter in an electrical system is described. The novel method samples an electrical energy signal and determines a relevant portion of the sampled electrical energy signal. The relevant portion of the electrical energy signal is then separately multiplied by a first and second reference waveform. The relevant portion may be reflective of a particular line cycle at a particular frequency of interest. In addition, other samples in the line cycle may be accumulated. The samples whose portions may be determined may be the first and/or last signal, while other sampled signals may be evaluated in whole.

43 Claims, 5 Drawing Sheets

FRACTIONAL SAMPLING OF ELECTRICAL ENERGY

CROSS REFERENCE TO RELATED APPLICATION

This application is related by subject matter to the inventions disclosed in the following commonly assigned application: U.S. patent application Ser. No. 12/119,919, filed on May 13, 2008, and entitled "Fractional Samples to Improve Metering and Instrumentation."

FIELD OF THE INVENTION

The disclosed embodiments are related to electronic electricity meters.

BACKGROUND

Much of the transmission and distribution of electrical energy over power lines is done at some nominal frequency, typically at 50 or 60 Hz. Historically, small variations in the nominal line frequency were of little concern to electromechanical watthour metering. Electromechanical meters were limited to basic metrics such as watthours or VARhours using phase shifting transformers, and the accuracy of the results were not generally dependent on frequency.

The recent deregulation of the utility industry has created a market for products that facilitate the efficient distribution and monitoring of electrical power. For example, one reason to monitor line frequency is the increased interest in accurate measurement of harmonics on the utility's power system. Historical metering practices had only a minor concern with harmonics. Today, however, an increase in customer loads has created an increase in harmonics, and thus greater interest in harmonic analysis on power systems. This is due, in part, because greater harmonics can create even greater loading on the system. Also, the use of harmonic power instead of main power can trick an electricity meter into underestimating the amount of power that is actually consumed by a customer. Therefore, there is a greater emphasis on harmonic analysis of power systems.

In addition to increased customer demand and deregulation, the advent of electronic energy meters has allowed such analysis to be processed and displayed by the meter. For example, electronic meters are capable of determining many characteristics on the power line including: phase angles from one voltage to another voltage, phase angles from a current to a voltage, per phase power factors, per phase voltages, per phase currents, per phase voltage harmonics, per phase current harmonics, per phase and system watts, per phase and system volt-amperes, per phase and system volt-amperes reactive, and total harmonic distortion for per phase voltages and currents.

Previously, electronic meters were subject to certain limitations in the way in which power line values were sampled. For example, calculations that require the sample to be tied to a set number of line cycles were difficult to determine. This is due, in part, to the inherent and varied fluctuations that occur around a nominal frequency, like 60 Hz. More specifically, although the United States power system is said to operate at a nominal frequency of 60 Hz, in practice the actual transmitted frequency is rarely exactly 60 Hz and instead typically varies around 60 Hz. As a result, it was very difficult for any particular sample to guarantee that it had sampled a whole number of line cycles. Instead, samples typically included a portion of a subsequent and undesired line cycle that was not part of the overall calculation. Therefore, when certain calculations required one or more integer line cycles, it became necessary to compensate for the expected inability to ensure that the sample reflected a whole line cycle.

One way to compensate for the expected error included taking a greater number of samples. In this way, by increasing the "denominator" of samples, the "numerator" of extra cycle error was minimized. Although effectively minimizing the inherent error, this approach typically required very large sample times and increased memory storage.

Another approach, used in cooperation with the first approach, made certain arithmetic assumptions based on the expected nominal frequency. For example, assuming a nominal frequency of 60 hz, using a sample rate of 2370 hertz sample provides 79 individual samples over two complete line cycles. Again, the problem with this approach is that it does not contemplate variations in the nominal 60 Hz frequency, nor does it accommodate other accepted nominal frequencies, like 50 Hz. In other words, calculations like harmonics that require samples taken over integer line cycles cannot be completely compensated for after the measurements and interim calculations are done.

Therefore, it should be appreciated that there is a need for providing more accurate techniques for measuring electrical power line characteristics.

SUMMARY

A novel method and device for measuring electrical parameters in an energy meter in an electrical system is described. The novel method samples an electrical energy signal and determines a relevant portion of the sampled electrical energy signal. The relevant portion of the electrical energy signal is then separately multiplied by a first and second reference waveform. The relevant portion may be reflective of a particular line cycle at a particular frequency of interest. In addition, other samples in the line cycle may be accumulated. The samples whose portions may be determined may be the first and/or last signal, while other sampled signals may be evaluated in whole. The first reference waveform may be reflective of a quadrature component of a frequency of interest for the sampled electrical, and the second reference waveform may be reflective of an in-phase component of a frequency of interest for the sampled electrical energy. The values may be used to determine frequency dependent quantities for the electrical power line, like total harmonic distortion, for example.

DETAILED DESCRIPTION

Most solid state or electronic electrical energy meters digitally sample voltage and current signals on one to three different phases, and process them to typically generate quantities for billing purposes. The meters typically measure basic power quantities like watthours, VARhours or VAhours. The electronic electrical energy meters also have become capable of conducting a variety of instrumentation and/or power line performance determinations. For example, these meters may be capable of determining the validity of the wiring external to the electronic meter itself, and other power line parameters, such as harmonics.

Systems and methods describing the novel techniques will now be described with reference to the figures. It will be appreciated by those of ordinary skill in the art that the description given herein with respect to those figures is for exemplary purposes only and is not intended in any way to limit the scope of the invention. For example, although an example meter may be used to illustrate the invention, it should be appreciated that this meter is merely provided for the purpose of clearly describing the methods and systems. However, this discussion is not intended to limit the disclosed embodiments. In fact, the disclosed techniques are equally applicable to other meters and metering systems.

Figure 1:
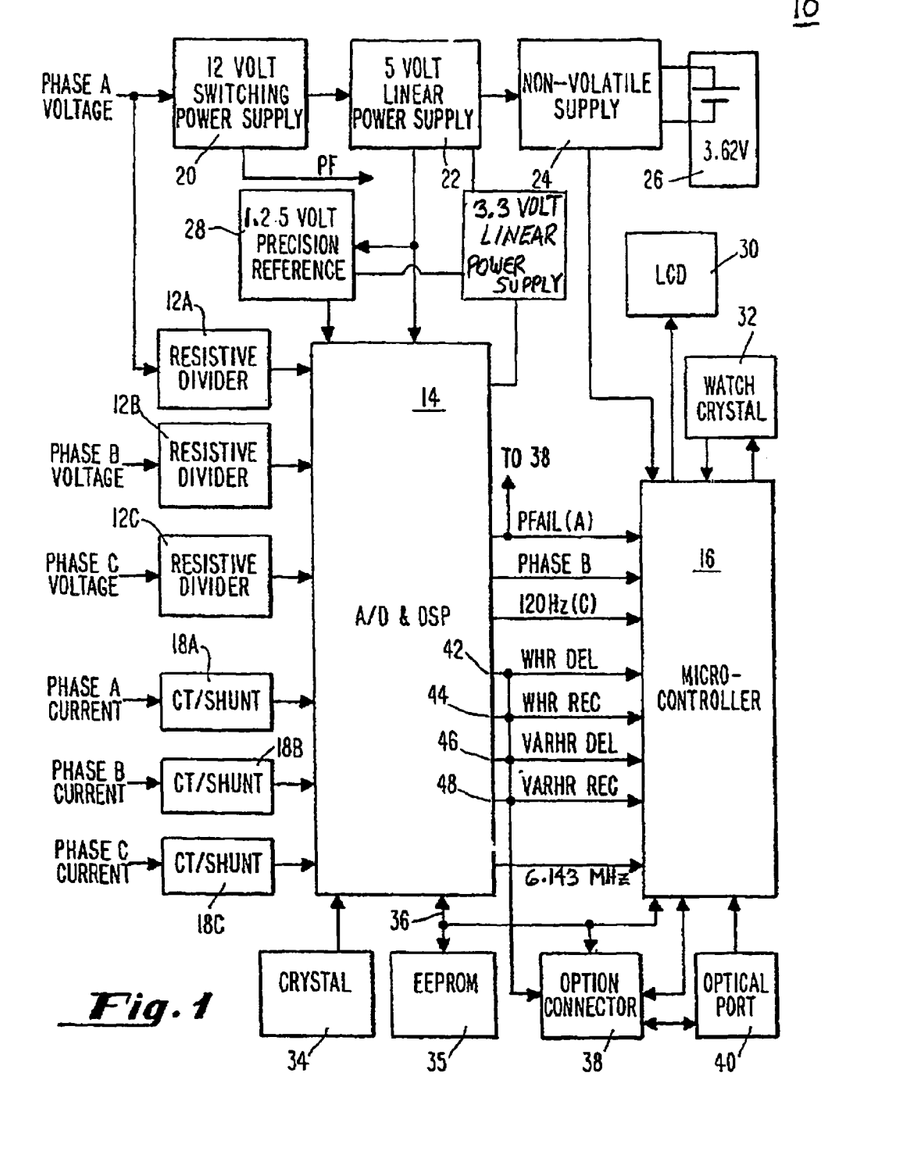
FIG. 1 is a block diagram of an electronic meter for measuring electrical parameters in an energy meter.

FIG. 1 is a block diagram showing the functional components of an example meter and their interfaces. As shown in FIG. 1, a meter 100 for metering three-phase electrical energy includes a digital LCD type display 30, a meter integrated circuit (IC) 14 which comprises A/D converters and a programmable digital signal processor (DSP), and a microcontroller 16. Analog voltage and current signals propagating over power distribution lines between the power generator of the electrical service provider and the users of the electrical energy are sensed by voltage dividers 12A, 12B, 12C and current transformers or shunts 18A, 18B, 18C, respectively.

The outputs of the resistive dividers 12A-12C and current transformers 18A-18C, or sensed voltage and current signals, are provided as inputs to the meter IC 14. The A/D converters in the meter IC 14 convert the sensed voltage and current signals into digital representations of the analog voltage and current signals. In a preferred embodiment, the A/D conversion is carried out as described in U.S. Pat. No. 5,544,089, dated Aug. 6, 1996, and entitled "Programmable Electrical Meter Using Multiplexed Analog-To-Digital Converters", which is herein incorporated by reference. The digital voltage and current representations are then input to the microcontroller 16 through an IIC bus 36.

The microcontroller 16 preferably interfaces with the meter IC 14 and with one or more memory devices through a IIC bus 36. A memory, preferably a non-volatile memory such as an EEPROM 35, is provided to store nominal phase voltage and current data and threshold data as well as programs and program data. Upon power up after installation, a power failure, or a data altering communication, for example, selected data stored in the EEPROM 35 may be downloaded to the program RAM and data RAM associated within the meter IC 14, as shown in FIG. 1. The DSP under the control of the microcontroller 16 processes the digital voltage and current signals in accordance with the downloaded programs and data stored in the respective program RAM and data RAM.

To perform line frequency measurements and compensation, the meter IC 14 monitors the line frequency over, for example, multiple line cycles. It should be understood that the number of line cycles is preferably programmable and a different number of line cycles may be used for designated measurements. In fact, using the disclosed techniques it may be possible to perform power line measurements and analysis using less than one full line cycle.

Following power-up at installation, a service test may be performed to identify and/or check the electrical service. The meter may be preprogrammed for use with a designated service or it may determine the service using a service test. When the service test is used to identify the electrical service, an initial determination is made of the number of active elements. To this end, each element (i.e., 1, 2, or 3 elements) may be checked for voltage. Once the number of elements is identified, many of the service types can be eliminated from the list of possible service types. The voltage phase angle relative to phase A (or any other phase) may then be calculated and compared to each phase angle for a-b-c or c-b-a rotations with respect to the remaining possible services. If a valid service is found from the phase angle comparisons, the service voltage may be determined by comparing the RMS voltage measurements for each phase with nominal phase voltages for the identified service. If the nominal service voltages for the identified service matches measured values within an acceptable tolerance range, a valid service is identified and the phase rotation, service voltage, and service type may be displayed. The service may be locked, i.e., the service information is stored in a memory, preferably a non-volatile memory, such as the EEPROM 35, manually or automatically. There are a variety of possible service types including 4-wire wye, 3-wire wye, 4-wire delta, 3-wire delta, or single phase, just to name a few.

When the service type is known in advance and locked, the service test may check to ensure that each element is receiving phase potential and that the phase angles are within a predetermined percentage of the nominal phase angles for the known service. The per-phase voltages also may be measured and compared to the nominal service voltages to determine whether they are within a predefined tolerance range of the nominal phase voltages. If the voltages and phase angles are within the specified ranges, the phase rotation, service voltage, and service type may be displayed on the meter display. If either a valid service is not found or the service test for a designated service fails, a system error code indicating an invalid service may be displayed and locked on the display to ensure that the failure is noted and evaluated to correct the error.

It should also be appreciated that meter 100 also provides for remote meter reading, remote power quality monitoring, and reprogramming through an optical port 40 and/or an option connector 38. Although optical communications may be used in connection with the optical port 40, option connector 38 may be adapted for RF communications or electronic communications via a modem, for example.

The disclosed techniques may be in firmware, wherein such operations are enabled by the correct programming of data tables. However, it should also be appreciated that the disclosed techniques also may be using software and/or hardware, or in a combination of the two. In fact, the disclosed techniques are not limited to any particular implementation but contemplate implementation in any tangible form.

After the service type is determined, the per phase voltage magnitudes may be checked. If the per phase voltage magnitudes fall within the allowable parameters for the phases, then a nominal service voltage may be determined. Determination of a valid type and a valid nominal service voltage for that type define detection of a valid service.

Voltage-to-voltage phase angles may be used in the determination of the service type. Phase angle determination may be accomplished in a number of different ways, including counting samples between similar voltage zero crossings or by conducting a Discrete Fourier Transform (DFT) between one of the phase voltages of interest and an ideal signal triggered by the other voltage of interest. Often, techniques for measuring the phase angles between two sinusoidal signals are frequency-dependent. Thus, the determination of the service type that the meter is connected to may be a frequency-dependent determination, although the disclosed techniques are not so limited.

A DFT is used to determine the content of a particular frequency signal within an input signal. More specifically, each sampled signal is composed of many different signals of various frequencies and magnitudes. The DFT may operate to evaluate a specific frequency of interest (e.g., 50 or 60 Hz or harmonic thereof). The DFT provides information, for example, regarding how much of a sampled signal's magnitude is provided by a particular frequency of interest, or what the angle is of that signal with respect to another signal.

The DFT is determined, for example, by multiplying samples of the electrical energy signal by two standard waveforms having a substantially similar frequency. One waveform may be approximately 90 degrees out of phase with the other waveform. One waveform may be referred to as the in-phase component and the other waveform may be the quadrature component. These waveforms are also referred to as "carriers." The two sine waves, although of the same or similar frequency, are out of phase with each other. The "In-Phase" sine wave begins at 0 degrees on the waveform, and its starting point can be used to reference the results to another event or waveform. The "Quadrature" carrier is also of the same or similar frequency as the "In-Phase" carrier, but it begins 90 degrees behind the "In-Phase" signal. If beginning of the carrier signal is defined as 0 degrees, then the two carrier signals can be defined as: "In-Phase" carrier=Sine($\omega$t) and "Quadrature" carrier =−Cosine($\omega$t), where $\omega$=frequency of interest, t=time, and $\omega$t=$\theta$, which is the angle for any point in time t.

Actual determination of the Sine and −Cosine values may be done in such a manner as to allow almost any frequency. This is due to the fact that it may need to calculate characteristics of various different nominal frequencies, on tolerances around those frequencies, and on harmonics of the tolerances of the different nominal frequencies. For this reason, the Sine and −Cosine carriers typically may be calculated at time of use, as opposed to being read from a predefined table. To calculate actual carrier values, the following formulas may be used:

$$\sin(\theta+\delta\theta)=[\sin(\theta)*\cos(\delta\theta)]+[\cos(\theta)*\sin(\delta\theta)]$$

$$\cos(\theta+\delta\theta)=[\cos(\theta)*\cos(\delta\theta)]-[\sin(\theta)*\sin(\delta\theta)]$$

Taking the negative cosine values gives the following, where $\theta$ is the angle of the carrier signal, and $\delta\theta$ is the change in angle of the carrier signal between consecutive samples:

$$\sin(\theta+\delta\theta)=[\sin(\theta)*\cos(\delta\theta)]-[-\cos(\theta)*\sin(\delta\theta)]$$

$$-\cos(\theta+\delta\theta)=[-\cos(\theta)*\cos(\delta\theta)]+[\sin(\theta)*\sin(\delta\theta)]$$

This technique allows the frequency of interest (e.g., carrier frequency) to be defined by the two fixed values: sin($\delta\theta$) and cos($\delta\theta$). It also may allow for the simple calculation of the carrier signals for each subsequent sample time by use of only the two fixed values and the carrier signal values for the previous sample times. These two values may be calculated by an external microprocessor and provided to the DSP in the format of a request, and/or they may be calculated by the DSP itself.

Figure 2:
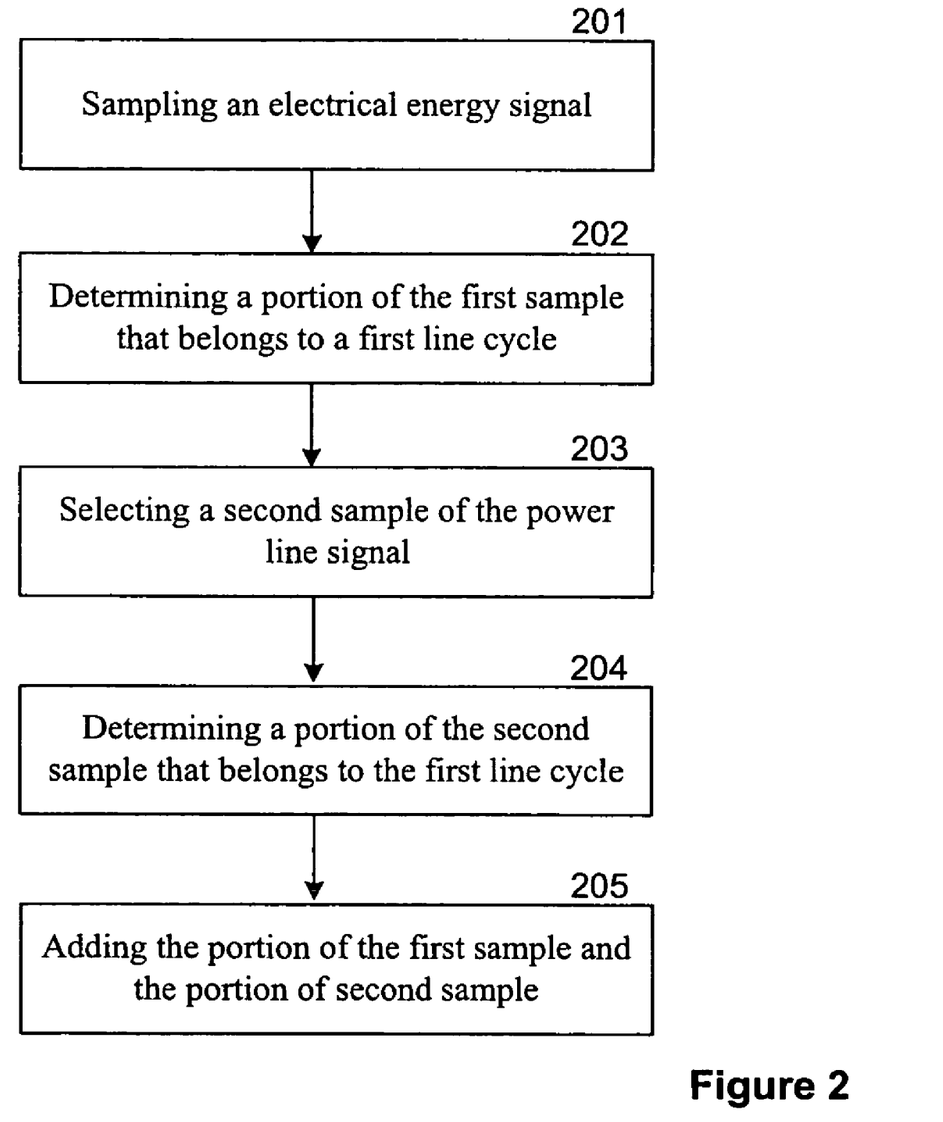
FIG. 2 represents a flow diagram for measuring electrical parameters in an energy meter in an electrical system.

FIG. 2 is a flow diagram for measuring electrical parameters in an energy meter in an electrical system. As shown in FIG. 2, at 201 a first sample of a power line signal is sampled. At 202, it is determined whether a portion of the first sample belongs to a first line cycle or to another line cycle. At 203, a second sample of the power line signal is selected. At 204, it is determined whether a portion of the second sample belongs to the first line cycle, or to another line cycle. At 205, the portion of the first sample and the portion of the second sample are added.

Figure 3A:
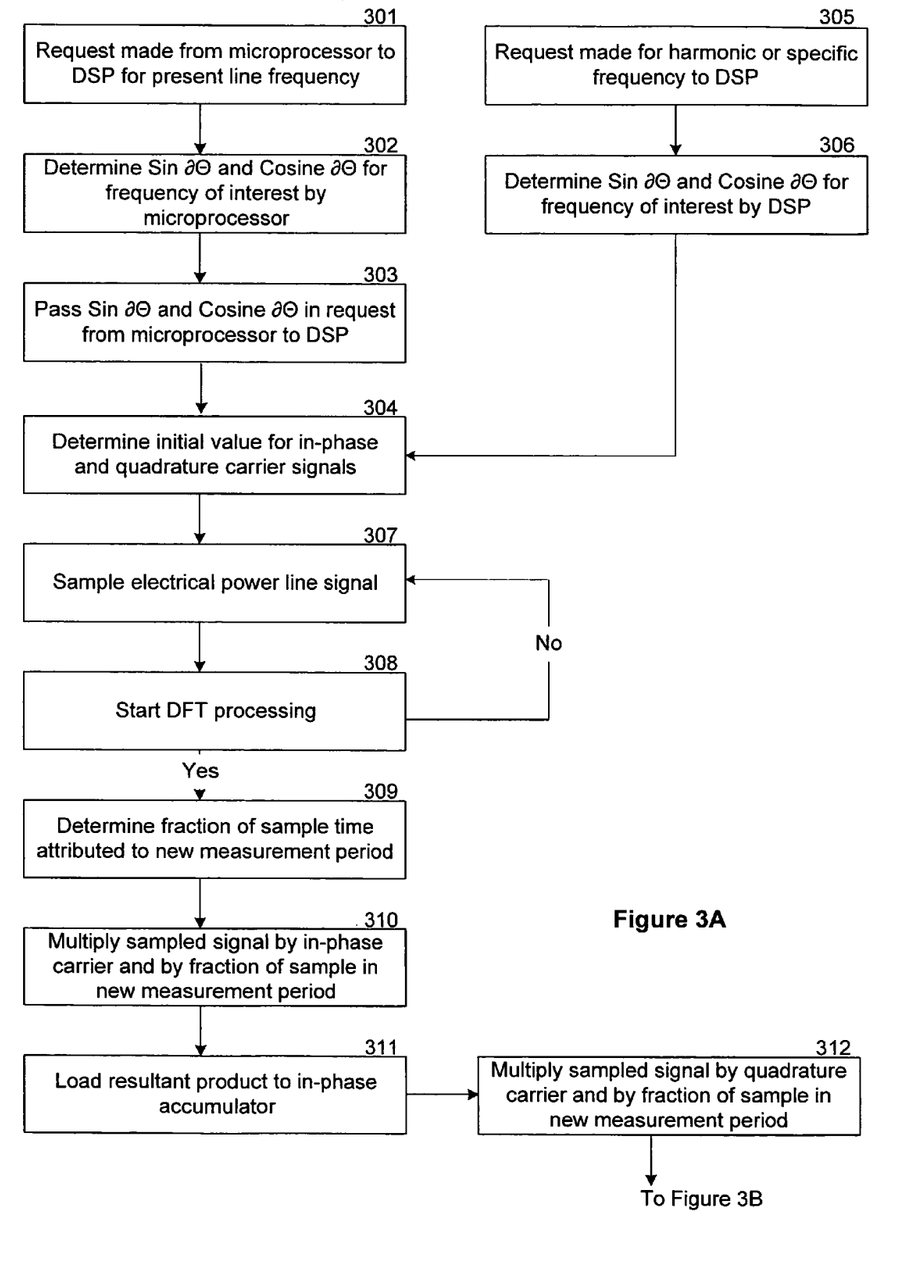
FIGS. 3A-3C represent a flow diagram for measuring electrical parameters in an energy meter in an electrical system.
Figure 3B:
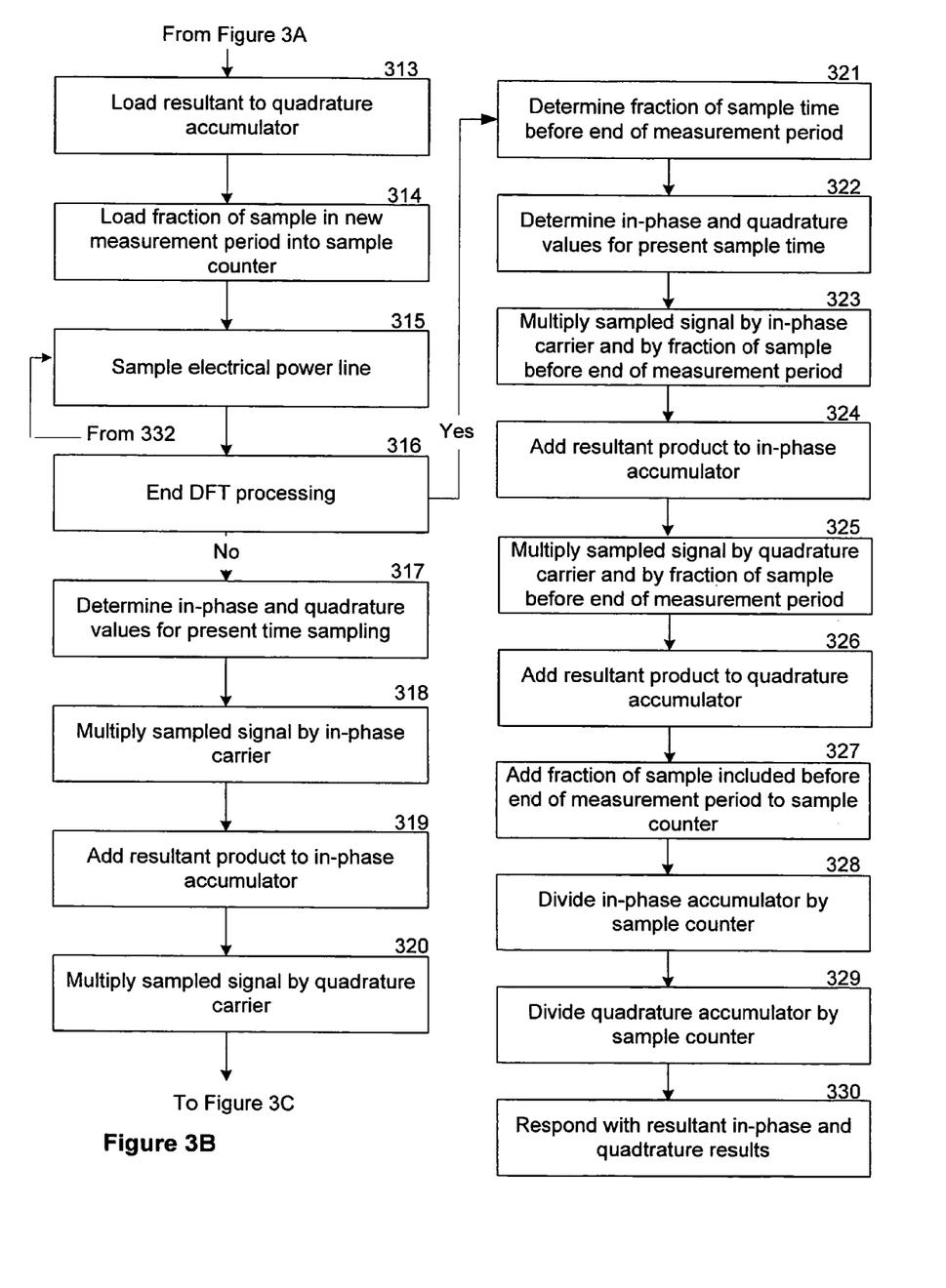
Figure 3C:
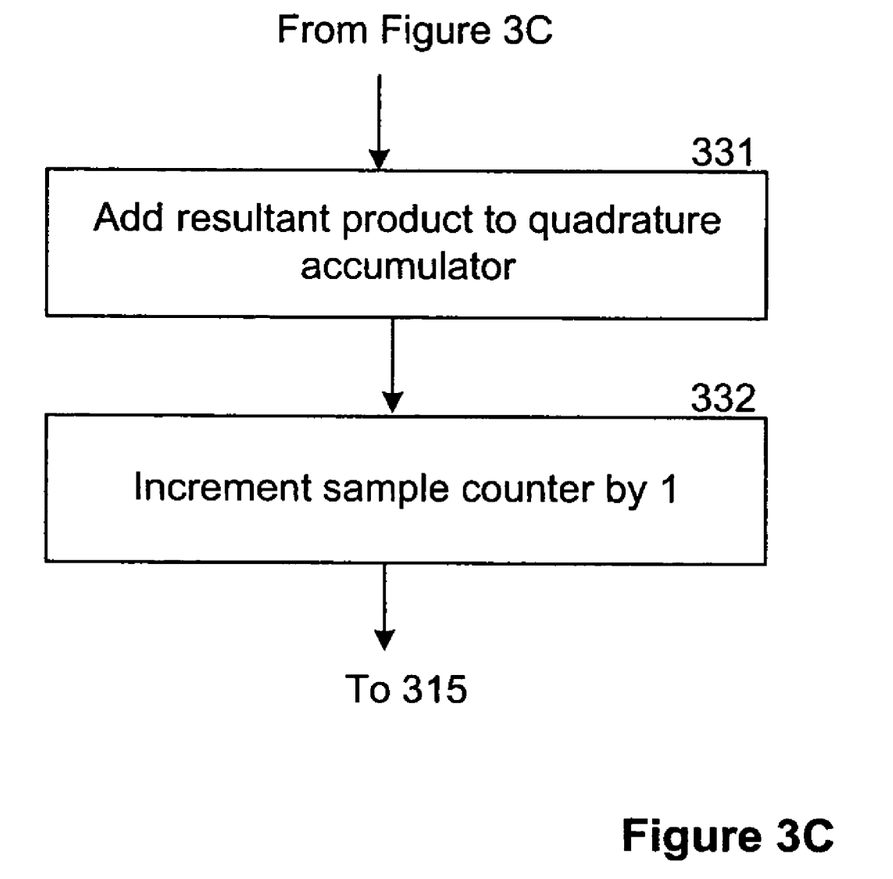

FIGS. 3A, 3B and 3C represent a flow diagram for measuring electrical parameters in an energy meter in an electrical system. It should be appreciated that the process may be initiated by the microprocessor by a number of various methods. FIGS. 3A, 3B and 3C provide just one example method where the microprocessor passes fixed values (sin($\delta\theta$) and cos($\delta\theta$)) to the DSP to initiate the request. As shown in FIG. 3A, in 301 the microprocessor requests actual line frequency from the DSP. It should be appreciated that actual line frequency may not have to be determined, but may be assumed to be a nominal line frequency. However, in this embodiment, making this assumption may result in some discrepancy if the desired result should be based on the actual line frequency. The resultant discrepancy may be a function of how far off the actual frequency is from the nominal frequency, and may be acceptable in some instances.

In 302, the values for sin($\delta\theta$) and cos($\delta\theta$) are determined, based on the results of the actual line frequency determined in 301. In 303, the values for sin($\delta\theta$) and cos($\delta\theta$) may be passed to the DSP as a request. Alternatively, as indicated in 305, it should be appreciated that the microprocessor may make a request of a particular harmonic of interest, instead of or in addition to the nominal and/or actual frequency. The harmonic may be fixed values that define the frequency of interest. Such harmonics may include the fundamental harmonic or any numbered harmonic. In this instance, the DSP may keep track of and/or be able to calculate actual line frequency. With the actual line frequency, the DSP then calculates the two fixed values, sin($\delta\theta$) and cos($\delta\theta$), as shown in 306. Once the request has been passed to the DSP, the initial values of the in-phase and quadrature carriers are determined in 304.

Samples of the electrical power line may then be made in 307. The electrical power signal typically is represented as an analog signal. Sampling such an analog signal typically divides the analog signal into discrete digital samples having discrete amplitudes. Each sample typically is much shorter than one cycle. For example, one sampling technique may divide each cycle into approximately 40 samples (i.e., the sample time is about $\frac{1}{40}^{th}$ of a line cycle). However, often it is difficult to ensure that the $40^{th}$ sample (or the total number of samples) fully captures just one whole line cycle. Of course, when there is not a certain number of samples in a line cycle, the resultant calculations that are made over integer number of samples for a line cycle may be undesirably inaccurate.

At 308, it is determined whether to start the DFT processing. If the DFT is not ready to start processing, then the method returns to 307 to get the next power line sample. This process repeats until the DFT is ready to begin processing. The determination as to whether DFT processing is ready to begin may be determined via a variety of methods. This may include, but is not limited to, any of the following: when the analog power signal (e.g., on any of the available phases) reaches a predetermined point (e.g., zero crossing) and/or usage of an arbitrary starting point.

In the context of using a zero crossing, an example method to determine when the length of test time is an integer number of line cycles may begin with a positive Phase A voltage zero crossing and terminate after some number of positive Phase A voltage zero crossings. Also, using a different and perhaps arbitrary starting point may require a different method for calculation length determination. This may be accomplished using a counter to determine a number of sample calculations. For example, there may be a certain number of samples P required to process N full cycles.

As stated earlier, often the problem with DFT calculations is that they need to be done over an integer number of line cycles, and when the frequency of the measured signal does not evenly divide into the sample rate then the measurement can not be accomplished for an integer number of samples, resulting in some discrepancy. One method to minimize this discrepancy is to handle fractional portions of a sample. In other words, fractional portions of a sample may need to be handled in either the first sample, the last sample or both the first and last samples, for example.

In order to determine the relevant fractional portions of the sample, it may be necessary to determine which portion of the sample should be included in the DFT calculation, at 309. Once the relevant fraction or portion of the sample is determined, the signal of interest is multiplied by both the in-phase carrier signal and the relevant fraction at 310. The resultant product may be loaded in an accumulator, called for example, the in-phase accumulator in 311. The electrical signal of interest may then be multiplied by both the quadrature carrier and the relevant fraction in 312. As shown in FIG. 3B, the resultant product may be loaded in an accumulator, called for example, the quadrature accumulator in 313. The fraction of the sample, representative of the portion of the sample that is to be included in the DFT calculation, may then be loaded into a counter at 314, called a sample counter. The sample counter may accumulate the total number of samples for which accumulation is done during the entire DFT calculation.

A next sample of the electrical power line signal of interest may be acquired, at 315. At 316, it is determined whether the DFT processing is completed. This determination may be based upon the method used to initiate the calculation (e.g., zero crossing), and should cause the sampling of the electrical signal of interest for some integer number of cycles, or as close to an integer number as possible. If, at 316, it is determined that the DFT processing has not ended, the method continues to 317, where the in-phase and quadrature carrier values are calculated for the present sample time. At 318, the present sample of the electrical signal of interest is multiplied by the in-phase carrier, and at 319 the resultant product is added to the in-phase accumulator. At 320, the present sample of the electrical signal of interest is multiplied by the quadrature carrier. As shown in FIG. 3C, at 331, the resultant is added to the quadrature accumulator. At 332, the sample counter may be incremented (e.g., by 1). Following 332, the method returns to 315 to continue to accumulate the total number of samples for which accumulation is done during the DFT calculation. The method acquires a next sample of the electrical signal of interest, and processing continues until the end of DFT processing is determined at 316.

Returning to FIG. 3B, if it is determined at 316 that DFT processing is complete, it may be necessary to determine which portion of the present sample (or previous or subsequent sample) should be included in the DFT calculation, at 321. Next, at 322, in-phase and quadrature carrier values may be calculated for the present sample time. At 323, the electrical signal of interest is multiplied by both the in-phase carrier signal and the fraction of the signal that is to be included in the DFT. The product is then added to the in-phase accumulator, at 324. At 325, the electrical signal of interest is multiplied by both the quadrature carrier signal and the fraction of the signal that is to be included in the DFT. At 326, the product is added to the quadrature accumulator. The fraction, representative of the portion of the sample that is to be included in the DFT calculation, is then added to the sample counter, at 327. At this point, the sample counter now has accumulated the total number of samples for which accumulation is done during the entire DFT calculation.

At 328, the in-phase accumulator is divided by the sample counter value to give an average in-phase result. Similarly, at 329, the quadrature accumulator is divided by the sample counter value to give an average quadrature result. At 330, the resultant in-phase and quadrature results are made available for the requesting routine to read.

The resultant in-phase and quadrature quantities (e.g., averages) are proportional to the in-phase and quadrature components of the signal of interest. The magnitude of the DFT result may be determined by the square root of the sum of the squares of the in-phase and quadrature quantities. The magnitude may be equivalent to the product of the RMS value of the frequency of interest in the sampled signal and the RMS value of either of the standard waveforms (i.e., it may be assumed that the RMS values of in-phase and quadrature waveforms are substantially the same). Typically, the peak value of the standard waveforms is 1, resulting in an RMS value of $1/\sqrt{2}$. So by dividing the resultant magnitude by the RMS value of one of the standard waveforms, the magnitude of the signal of desired frequency within the electrical power line signal may be determined.

The angle of the signal of interest may also be determined by use of the in-phase and quadrature terms. The resultant phase angle is determined by the following table:

| Sign of in-phase quantity | Sign of quadrature quantity | Angle Calculation (in degrees) |
|---|---|---|
| + | + | Arctan (quadrature/in-phase) + 0° |
| − | + | Arctan (quadrature/in-phase) + 180° |
| − | − | Arctan (quadrature/in-phase) + 180° |
| − | − | Arctan (quadrature/in-phase) + 360° |

Although the in-phase and quadrature terms are a function of the RMS values of the two standard waveforms, the RMS values of the two standard waveforms may not have to be removed as in the magnitude determination. Because they may have similar and/or identical values in both in-phase and quadrature terms, and the arctan function is performed on the quotient of the quadrature and in-phase values, the RMS values from the two standard waveforms may cancel each other.

For determination of the voltage-to-voltage phase angle of the frequency of interest, the DFT may be used again for this determination to allow a common function to be used for multiple purposes. In addition to the detection of the nominal phase angles, this functionality allows detection of individual harmonic values of higher frequencies. Availability of this functionality in addition to the ability to calculate RMS quantities, allows calculation of total harmonic distortion quantities, for example.

Although illustrated and described herein with reference to certain specific embodiments, the disclosed embodiments are not intended to merely be limited to the discussion. Rather, various modifications may be made in the details within the scope and range of equivalents of the claims and without departing from the invention. For example, various techniques may be used to determine the portion of the sampled signal attributed to the measurement period for the first sample or for the last sample.

When using an arbitrary starting point and a predefined number of samples, any fraction of the first sample may be included, and whatever remaining fraction of a sample time is left at the last sample time may be used for the last sample. Although simplicity would suggest using either a whole sample for the first or last sample calculation, so the non-integer fraction of a sample time would only have to be calculated once, either method could be used.

For methods using actual electrical energy signals, zero crossings or points derived from zero crossings (e.g., consistent angular points on a waveform) are typically used as reference points for carrier initialization. One technique for determining the location of the actual zero crossing between two samples (and thereby the fractional division between previous cycle and subsequent cycle) is linear approximation. For example, as is well known to those skilled in the art, digital sampling of an analog power line electric energy signal typically divides the analog signal into discrete digital samples having discrete amplitudes, for example, −1, 1, 2, and −2. Therefore, for example, if a zero crossing has been sensed in one sample, it may be noted that the sample is a positive zero crossing if it traveled from a value of negative 2 (i.e., below the zero crossing) to a value of positive 1 (i.e., above the zero crossing), for a total travel value of 3. Linear approximation means that ⅓ of the sampled signal reflects the portion above the zero crossing and the remaining ⅔ of the sampled signal reflects the portion below the zero crossing (or previous cycle). Determination of which fractional portion of the sample is to be used is based on whether the first or last sample of the calculation is being performed.

Again, linear approximation is just one technique of determining the fractional portions of a sample time which belong to the previous cycle and the subsequent cycle on an actual electrical energy signal. However, since electrical energy signals typically are not linear, especially in the presence of harmonic distortion, other techniques may be used to interpolate where the actual zero crossing occurred between the two samples. Linear approximation uses typically uses two sample magnitudes, but other curve fitting techniques using more than two samples (e.g., 3-point parabolic fit) may give yet better results in some instances.

The contemplated embodiment also may use counters to count the number of samples over a line cycle of the electrical energy signal, and registers to store the complete counter values from the last cycle of each signal. For example, counters T0, T1 and T2 may count samples from voltage positive zero crossing to positive zero crossing on phases A, B and C, respectively. These counters may be used to determine line frequency according to the following:

Frequency=1/(number of samples per cycle*time per sample).

The contemplated techniques may include counters that count the number of samples from voltage positive zero-crossing to positive zero-crossing on Phases A, B and C respectively. In this technique, a cycle may be defined on individual phases using these counters. For example, a cycle length may be determined by counting the number of samples it takes to transition from a first positive zero crossing to a subsequent positive zero crossing. In some embodiments it may be desirable to track the cycle length of each phase (e.g., instead of just one phase), particularly in those meters that no longer require Phase A to be present for operation. In this way, it may be desirable to determine cycle length by turning to another phase (e.g., B or C), for example if one phase is not available.

Because actual zero crossings may occur between individual samples, to make the sample counters more accurate, the location of the zero crossing may be estimated in order to attribute some fraction of the sample time to the previous cycle, and the remaining fraction of the sample time to the subsequent cycle. If, for example, the last negative sample has value −X, and following sample is positive of value Y, then the fraction −(−X)/(Y−(−X)) is the portion of the fraction belonging to the previous cycle. The fraction Y/(Y−(−X)) is the portion of the fraction belonging to the next cycle. It should be appreciated that while this technique is demonstrated with linear approximation, other means of approximation have been contemplated and may be used.

The working counter values T0, T1 and T2 may include both an integer portion and a fractional portion. At the beginning of a cycle, the fractional portion of the sample time attributed to the new cycle (after the zero crossing), is loaded as the initial value of the working counter. Each subsequent sample time increments the working counter by 1 until a sample is obtained that demonstrates a like zero crossing as used to define the beginning of a subsequent cycle. The fraction of this last sample attributed to the cycle just completed (before the zero crossing) is added to the working counter. This final value of the working counter (e.g., T0, T1 or T2) may then be stored in another register (e.g., LastT0, LastT1 or LastT2, respectively). The registers stored will now represent the frequency of the last full cycle of phases A, B and C respectively.

It should be appreciated that when the phases are present and available, it may be that the values should be substantially the same, assuming they are monitoring the same frequency. As a result, in determining the present line frequency of the metering system, any of the values (e.g., LastT0, LastT1 or LastT2) may be valid values to use, although in some embodiments it may be desirable to select one to define the metering system frequency. Nevertheless, it should be appreciated that other methods for defining metering system frequency are contemplated, such as averaging the values together, further filtering the LastT0, LastT1 or LastT2 values with previous values to obtain more stable results, etc., for example.

Accurate present metering system line frequency (and number of samples per line cycle) is important when performing DFT calculations, in order to know how many samples over which to do DFT calculations. They are important to be able to be reported back to a controlling system, such as microprocessor 16 in FIG. 1, in order for the specific frequency to be determined externally, or in order for the specific frequency to be known if only a specific harmonic is requested.

As a result of the possibility of not having an integer number of samples in a cycle, the disclosed techniques define a method of getting improved accuracy results as compared to calculations done for an integer number of samples for the same cycle. The method involves processing fractional portions of a sample within the DFT calculation itself. These fractional accumulations are likely to be appropriate for the first and last samples in the sample sequence, because it is these samples which may be more likely to overlap with previous or subsequent cycles.

For example, the actual voltage values for the first positive Phase A voltage zero-crossings may be represented by sample values −A and B, and the final Phase A voltage zero-crossing values may be represented by sample values −X and Y. Also, the value of the first sample of the signal of interest (which, it should be appreciated, may be a voltage or current signal from Phase A, B or C) may be referred to as J, and may be from the same point in time as the B zero crossing point. Therefore, the initial value of T0 in this example may be: B/(B−(−A)).

The first accumulations may be referred to as "fractional," in order to exclude any portion of the value J that corresponds to a previous cycle, and may be calculated as follows:

"In-Phase" Component=$[B/(B-(-A))]*0*J$

"Quadrature" Component=$[B/(B-(-A))]*-1*J$

Accumulation Sample counter=$[B/(B-(-A))]$ (where the 0 and −1 are the $\sin(\theta)$ and $-\cos(\theta)$ for $\theta=0$ degrees).

If K is the value of the second sample of the signal of interest, then the next accumulations may be referred to as integer accumulations (i.e., it does not include a fractional portion of a previous or subsequent cycle), it may be defined as follows:

"In-Phase" Component="In-Phase" Component+$[\sin(\theta)*K]$

"Quadrature" Component="Quadrature" Component+$[-\cos(\theta)*K]$

Accumulation Sample counter=Accumulation Sample counter+1

(where $\theta$ is the angular value of one sample time).

These integer accumulations may continue for subsequent samples that represent the same cycle until the final Phase A positive zero crossing is detected, indicating a new cycle. It should also be appreciated that this may also occur over multiple cycles where integer accumulations occur for subsequent samples until the final Phase A positive zero crossing of the final cycle is detected. The last Phase A zero crossing may have sample values of −X (last sample of previous cycle) and Y (first sample of subsequent cycle). The sample values of the signal of interest, corresponding to Phase A values −X and Y, may be referred to as S and T respectively. Therefore, the last integer (i.e., non-fractional) accumulation may be defined as follows:

"In-Phase" Component="In-Phase"+$[\sin(\theta)*S]$

"Quadrature" Component="Quadrature"+$[-\cos(\theta)*S]$

Accumulation Sample counter=Accumulation Sample counter+1

(where $\theta$ is the angular value appropriate for this point in time).

The final accumulation of the cycle of interest, which may be a fractional sample assuming that some portion of the sampled signal overlaps with a subsequent cycle may be defined as follows:

"In-Phase" Component="In-Phase"+$[-(-X)/(Y-(-X))]*[\sin(\theta)*T]$

"Quadrature" Component="Quadrature"+$[-(-X)/(Y-(-X))]*[-\cos(\theta)*T]$

Accumulation Sample counter=Accumulation Sample counter+$[-(-X)/(Y-(-X))]$ (where $\theta$ is the angular value appropriate for this point in time).

The final "In-Phase" and "Quadrature" results may be acquired by dividing the summations by the number of samples accumulated, where it should be appreciated that the number of accumulated samples also may be fractional:

"In-Phase"="In-Phase"/Accumulation Sample counter

"Quadrature"="Quadrature"/Accumulation Sample counter

It should be appreciated that in some instances the cycle of interest may be represented by an exact integer number of samples. However, it should also be appreciated that this is a relatively unlikely occurrence because the base frequency of the measured signal is variable, along with other tolerances, and is typically not an exact number of samples. Also, if the signal of interest has the same or similar zero crossing as the trigger signal (typically Phase A voltage), then the amount of accumulation during the first and last sample times may be relatively small. However, it should also be appreciated that where the signal of interest is relatively out of phase with the trigger signal, significant amounts of accumulation may occur in the first and last sample time, and the fractional accumulation greatly improves the results.

It also should be appreciated that the above examples are riot meant to be exclusive, but are just examples of many possible implementations contemplated. For example, it may be possible to define the line cycles in another way. More specifically, a line cycle length may be defined by a counter whose length may be defined by a number of samples. A value may define the number of samples required for line cycle and may be named TestMasterTx. TestMasterTx may be constantly updated by values LastT0 or LastT1 or LastT2, where the values T0, T1 and T2 may be the sample counters for Phases A, B and C respectively. Valid values from these three registers may be directly loaded into TestMasterTx or used for example in a filtering algorithm to generate another new value to be loaded to TestMasterTx. Use of TestMasterTx as the defining length of a cycle may permit ignoring of the actual zero crossings used to start and stop DFT calculations, and allow use of arbitrary starting points. It should be appreciated that although discussion has centered on electrical energy signals directly measured, such as voltages and current for Phases A, B and C, this technique contemplates use of other signals not necessarily directly measured. Such values may include values such as ground current (e.g., from the sum of the phase currents), or line to line voltages (e.g., calculated from the difference between two line to neutral signals), or from voltages that exist but are not brought to the meter (e.g., Phase B voltage in a 3-element 4-wire wye service where Phase B voltage is calculated as the negated vector sum of the Phase A and Phase C voltages).

Where the last fractional accumulation is made to define the length of a complete cycle, the last values of T0, T1 and T2 may be stored in other registers referred to as LastT0, LastT1 and LastT2. A single sample counter may be used for internal purposes to control processes which should occur on cycle based intervals, and may be named MasterTx. MasterTx may be initially loaded with a value of 0. Each sample time may increment MasterTx by 1, until it reaches or exceeds TestMasterTx. Once MasterTx meets or exceeds TestMasterTx, the amount by which TestMasterTx was exceeded may be used as the initial value of MasterTx for the subsequent cycle, at which point TestMasterTx value may be reloaded with the LastT0, or LastT2, or LastT1, or another derived value representing the number of samples in a cycle at the present actual line frequency. In this example, the triggering signal to the DFT may be MasterTx. Because MasterTx may or may not be synchronized to the signals being measured, fractional accumulations may be used on first and last accumulations.

For example, using the same values as discussed above, the accumulations would begin when the MasterTx value is less than or equal to 1, and the first accumulation may be fractional, as follows:

"In-Phase" Component=[MasterTx]*0*$J$

"Quadrature" Component=[MasterTx]*−1*$J$

Accumulation Sample counter=[MasterTx]

(where the 0 and −1 are the sin(θ) and −cos(θ) for θ=0 degrees).

The following accumulations may be integer or non-fractional accumulations, defined for example as follows:

"In-Phase" Component="In-Phase"+[sin(θ)*$K$]

"Quadrature" Component="Quadrature"+[−cos(θ)*$K$]

Accumulation Sample counter=Accumulation Sample counter+1

(where θ is the angular value of one sample time).

The last integer accumulation may be defined as follows:

"In-Phase" Component="In-Phase"+[sin(θ)*$S$]

"Quadrature" Component="Quadrature"+[−cos(θ)*$S$]

Accumulation Sample counter=Accumulation Sample counter+1

(where θ is the angular value appropriate for this point in time).

The final accumulation, which may be fractional, may come when MasterTx is again less than or equal to 1, and would be:

"In-Phase" Component="In-Phase"+[1−MasterTx]* [sin(θ)*$T$]

"Quadrature" Component="Quadrature"+[1−MasterTx]*[−cos(θ)*$T$]

Accumulation Sample counter=Accumulation Sample counter+[1−MasterTx]

(where θ is the angular value appropriate for this point in time).

The final "In-Phase" and "Quadrature" results may be acquired by dividing the summations by the number of samples accumulated, as follows:

"In-Phase" Component="In-Phase"/Accumulation Sample counter

"Quadrature" Component="Quadrature"/Accumulation Sample counter

This technique further may incorporate certain assumptions to facilitate faster processing. For example, it may estimate how many samples long the previous cycle was and assume that the next cycle is approximately the same. This assumption may be acceptable because while variations over a large period of time may be great, variations between adjacent cycles typically are not.

Calculations described above should not be considered to be limited to a single electrical signal of interest. One or more signals can be analyzed at substantially the same time by use of the same in-phase and quadrature carrier values. The only requirements are additional independent in-phase and quadrature accumulators for each set of input signals to be analyzed.

Also, multiple sets of DFT can be run with different in-phase and quadrature carrier signal frequencies. These additional sets must of course have in-phase and quadrature carriers of the frequency of interest different from the first set of DFT calculations. Also independent in-phase and quadrature accumulators must be available for each signal being analyzed in the additional DFT sets. Yet, in some embodiments, as long as the additional sets of DFTs start and stop at the same points in time (and perhaps accumulate over the same periods), then results may be available to allow for faster calculation of the different harmonics, as well as allowing calculation of the phase angle of one harmonic with respect to another harmonic.

It also should be appreciated that while use of a fixed table of carrier signal values is problematic in the presence of a variable line frequency, use of a dynamically loaded table of in-phase and quadrature carrier values, based on present line frequency, would have some advantages. These would include potentially increased accuracy for carrier signal values (over the above mentioned calculation method), and decreased processing requirements for the DSP. But potential disadvantages may include a longer delay from the time the actual line frequency was measured to initiation of the DFT calculation (due to calculation time for the carrier signal values as well as the download time), and increased communications requirements (due to the downloading of the table).

What is claimed:

1. A method of sampling a power line signal, comprising:
selecting a first sample of a power line signal;
determining a portion of the first sample that belongs to a first line cycle; and
selecting a second sample of the power line signal;
determining a portion of the second sample that belongs to the first line cycle;
adding the portion of the first sample and the portion of the second sample;
determining a frequency of interest of the power line signal, wherein the frequency of interest is at least one of the following:
a nominal frequency, a harmonic of the nominal frequency, a tolerance frequency or a harmonic of the tolerance frequency, and wherein the nominal frequency is a standard power line signal frequency and the tolerance frequency differs from the nominal frequency; and
calculating quantities of the power line signal for the frequency of interest including at least one of the following:
total harmonic distortion, magnitudes of components within a signal of a particular frequency, angles of a frequency signal with respect to another signal, or harmonic energy.

2. The method of claim 1, further comprising determining a portion of the first sample that belongs to a second line cycle.

3. The method of claim 1, further comprising determining a portion of the second sample that belongs to a second line cycle.

4. The method of claim 1, further comprising multiplying the portion of the first sample and the portion of the second sample with a first reference waveform.

5. The method of claim 4, wherein the first reference waveform is a quadrature component.

6. The method of claim 4, wherein the first reference waveform has an ideal frequency.

7. The method of claim 1, further comprising multiplying the portion of the first sample and the portion of the second with a second reference waveform.

8. The method of claim 7, wherein the second reference waveform is an in-phase component.

9. The method of claim 7, wherein the reference waveform has an ideal frequency.

10. The method of claim 1, further comprising accumulating multiple samples of the electrical energy signal.

11. The method of claim 10, further comprising determining a portion of at least one of the following: a first signal and a last signal.

12. The method of to claim 1, further comprising counting a number of samples between zero crossings of the power line signal.

13. The method of claim 12, further comprising determining a value for the sampled signal.

14. The method of claim 12, further comprising determining a value for each sampled signal in a cycle and averaging the value by the number of samples.

15. The method of claim 1, wherein the portion of the sampled electrical signal is determined as a function of a characteristic of the electrical energy signal.

16. The method of claim 15, wherein the characteristic of the electrical energy signal is a zero crossing.

17. The method of claim 15, wherein the characteristic of the electrical energy signal is a repeating arbitrary point.

18. The method of claim 1, wherein the sampling comprises determining a time interval between a plurality of samples of a signal waveform and counting a number of samples between a plurality of zero crossings of the signal waveform.

19. The method of claim 1, further comprising determining an angle of the signal of the ideal frequency within the input signal waveform with respect to the reference waveform.

20. The method of claim 1, wherein the line cycle length is determined by a number of samples.

21. An electrical energy meter for measuring frequency dependent electrical parameters in an electrical system that provides an electrical energy signal having a varying frequency, comprising:
   a digital signal processor that samples the electrical energy signal;
   a microprocessor, wherein the microprocessor requests a line frequency from the digital signal processor, and wherein the microprocessor provides the digital signal processor with a sine and cosine value for a frequency of interest of the electrical energy signal, and wherein:
      the microprocessor determines a frequency of interest of the power line signal, wherein the frequency of interest is at least one of the following:
         a nominal frequency, a harmonic of the nominal frequency, a tolerance frequency or a harmonic of the tolerance frequency, and wherein the nominal frequency is a standard power line signal frequency and the tolerance frequency differs from the nominal frequency; and
      the microprocessor calculates quantities of the power line signal for the frequency of interest including at least one of the following:
         total harmonic distortion, magnitudes of components within a signal of a particular frequency, angles of a frequency signal with respect to another signal, or harmonic energy; and
      wherein the digital signal processor determines a portion of the sampled electrical energy signal that belongs to a first line cycle by multiplying the portion of the sampled electrical energy signal with a first reference waveform, and by multiplying the portion of the sampled electrical energy signal with a second reference waveform.

22. The electrical energy meter of claim 21, wherein the microprocessor requests from the digital signal processor a specific harmonic of the line frequency, and the digital signal processor determines the line frequency, sine and cosine value for the frequency of interest of the electrical energy signal.

23. The electrical energy meter of claim 21, wherein the first reference waveform is an in-phase component and the second reference waveform is a quadrature component.

24. The electrical energy meter of claim 21, wherein the processor multiples the sampled electrical signal by an in-phase ideal waveform to produce an in-phase product for each sample, and wherein the processor adds the in-phase product for each sample to an in-phase summing accumulator to produce an in-phase summing value, and wherein the processor multiples the sampled electrical signal by the quadrature ideal waveform to produce a quadrature product, and wherein the processor adds the quadrature product for each sample to a quadrature summing accumulator to produce a quadrature summing value.

25. The electrical energy meter of claim 21, wherein the digital signal processor determines a portion of the first sample that belongs to a second line cycle.

26. The electrical energy meter of claim 21, further comprising determining a portion of the first sample that belongs to a second line cycle.

27. The electrical energy meter of claim 21, wherein the digital signal processor accumulates multiple samples of the electrical energy signal.

28. The electrical energy meter of claim 21, wherein the digital signal processor counts a number of samples between zero crossings of the power line signal.

29. The electrical energy meter of claim 21, wherein the digital signal processor determines a value for the sampled signal.

30. The electrical energy meter of claim 21, wherein the digital signal processor determines the portion of the sampled electrical signal as a function of a characteristic of the electrical energy signal.

31. The electrical energy meter of claim 30, wherein the characteristic of the electrical energy signal is a zero crossing.

32. The electrical energy meter of claim 30, wherein the characteristic of the electrical energy signal is a repeating arbitrary point.

33. An electrical energy meter for measuring frequency dependent electrical parameters in an electrical system that provides electrical energy signal having a varying frequency, comprising:
   a digital signal processor that samples the electrical energy signal; and
   a microprocessor, wherein the microprocessor requests a line frequency from the digital signal processor, and wherein the microprocessor provides the digital signal processor with a table of sine and cosine values for a frequency of interest of the electrical energy signal, and wherein:
      the microprocessor determines a frequency of interest of the power line signal, wherein the frequency of interest is at least one of the following:
         a nominal frequency, a harmonic of the nominal frequency, a tolerance frequency or a harmonic of the tolerance frequency, and wherein the nominal frequency is a standard power line signal frequency and the tolerance frequency differs from the nominal frequency; and the microprocessor calculates quantities of the power line signal for the frequency of interest including at least one of the following:

total harmonic distortion, magnitudes of components within a signal of a particular frequency, angles of a frequency signal with respect to another signal, or harmonic energy; and wherein the digital signal processor determines a portion of the sampled electrical energy signal that belongs to a first line cycle by multiplying the portion of the sampled electrical energy signal with a first reference waveform, and by multiplying the portion of the sampled electrical energy signal with a second reference waveform, wherein the first and second reference waveforms are based on the table of sine and cosine values.

34. The electrical energy meter of claim 33, wherein the first reference waveform is an in-phase component (the downloaded table of sine values) and the second reference waveform is a quadrature component (the downloaded table of cosine values).

35. The electrical energy meter of claim 33, wherein the processor multiples the sampled electrical signal by an in-phase ideal waveform to produce an in-phase product for each sample, and wherein the processor adds the in-phase product for each sample to an in-phase summing accumulator to produce an in-phase summing value, and wherein the processor multiples the sampled electrical signal by the quadrature ideal waveform to produce a quadrature product, and wherein the processor adds the quadrature product for each sample to a quadrature summing accumulator to produce a quadrature summing value.

36. The electrical energy meter of claim 33, wherein the digital signal processor determines a portion of the first sample that belongs to a second line cycle.

37. The electrical energy meter of claim 33, wherein the digital signal processor accumulates multiple samples of the electrical energy signal.

38. The electrical energy meter of claim 33, wherein the digital signal processor counts a number of samples between zero crossings of the power line signal.

39. The electrical energy meter of claim 33, wherein the digital signal processor determines a value for the sampled signal.

40. The electrical energy meter of claim 33, wherein the digital signal processor determines the portion of the sampled electrical signal as a function of a characteristic of the electrical energy signal.

41. The electrical energy meter of claim 40, wherein the characteristic of the electrical energy signal is a zero crossing.

42. The electrical energy meter of claim 40, wherein the characteristic of the electrical energy signal is a repeating arbitrary point.

43. A method of sampling a power line signal, comprising:

selecting a first sample of a power line signal;

determining a portion of the first sample that belongs to a first line cycle;

selecting a second sample of the power line signal;

determining a portion of the second sample that belongs to the first line cycle, wherein at least one of the first sample or second sample includes an additional portion that does not belong to the first line cycle;

calculating an actual carrier value;

determining a frequency of interest of the power line signal, wherein the frequency of interest is at least one of the following:

a nominal frequency, a harmonic of the nominal frequency, a tolerance frequency or a harmonic of the tolerance frequency, and wherein the nominal frequency is a standard power line signal frequency and the tolerance frequency differs from the nominal frequency;

calculating quantities of the power line signal for the frequency of interest including at least one of the following:

total harmonic distortion, magnitudes of components within a signal of a particular frequency, angles of a frequency signal with respect to another signal, or harmonic energy and adding the portion of the first sample and the portion of the second sample.

* * * * *